United States Patent
Tokizaki

(10) Patent No.: US 12,272,379 B2
(45) Date of Patent: Apr. 8, 2025

(54) DISK DRIVE AND DISK DRIVE MANUFACTURING METHOD

(71) Applicants: Kabushiki Kaisha Toshiba, Tokyo (JP); Toshiba Electronic Devices & Storage Corporation, Tokyo (JP)

(72) Inventor: Tomoyuki Tokizaki, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 268 days.

(21) Appl. No.: 18/119,257

(22) Filed: Mar. 8, 2023

(65) Prior Publication Data

US 2024/0096372 A1    Mar. 21, 2024

(30) Foreign Application Priority Data

Sep. 16, 2022   (JP) ................. 2022-148605

(51) Int. Cl.
| | |
|---|---|
| H05K 5/00 | (2025.01) |
| G11B 25/04 | (2006.01) |
| G11B 33/14 | (2006.01) |
| H05K 5/06 | (2006.01) |
| H05K 5/13 | (2025.01) |

(52) U.S. Cl.
CPC ........ *G11B 25/043* (2013.01); *G11B 33/1466* (2013.01); *H05K 5/069* (2013.01); *H05K 5/13* (2025.01)

(58) Field of Classification Search
CPC .... G11B 25/043; G11B 33/1466; H05K 5/13; H05K 5/069
USPC ..................................... 361/679.33
See application file for complete search history.

(56) References Cited

U.S. PATENT DOCUMENTS

| | | | |
|---|---|---|---|
| 7,570,455 B2* | 8/2009 | Deguchi ............ | G11B 33/1446 365/232 |
| 7,876,528 B2 | 1/2011 | Uefune et al. | |
| 8,248,724 B2* | 8/2012 | Hayakawa ......... | G11B 33/1486 360/97.12 |
| 8,564,900 B2 | 10/2013 | Hirono et al. | |
| 9,001,458 B1* | 4/2015 | Vitikkate ............. | G11B 33/148 360/97.22 |
| 10,679,680 B2* | 6/2020 | Fitzgerald .......... | G11B 33/1466 |
| 2003/0179544 A1* | 9/2003 | Bruner .................... | G11B 33/08 |
| 2005/0141141 A1* | 6/2005 | Sekimoto ............. | G11B 33/122 |

(Continued)

FOREIGN PATENT DOCUMENTS

JP           5037438 B2    9/2012

*Primary Examiner* — Zhengfu J Feng
(74) *Attorney, Agent, or Firm* — Maier & Maier, PLLC

(57) ABSTRACT

A disk drive according to an embodiment includes a housing, a seal, and a piercing member. The housing includes a base having a first space, a first cover with a first hole, attached to the base, and a second cover covering the first cover. The first cover closes the first space. The first cover and the second cover are placed with a second space in-between. The first hole allows communication between the first space and the second space. The seal with a second hole, is attached to the first cover, the second hole allowing communication between the first space or the second space and the first hole. The piercing member includes an attachment part attached to the second cover in the second space, and a needle protruding from the attachment part toward the second hole.

14 Claims, 6 Drawing Sheets

(56) References Cited

U.S. PATENT DOCUMENTS

| | | | | |
|---|---|---|---|---|
| 2005/0265113 | A1* | 12/2005 | Abe | G11B 25/043 |
| | | | | 365/232 |
| 2006/0002006 | A1* | 1/2006 | Lee | G11B 33/08 |
| | | | | 360/99.15 |
| 2008/0024973 | A1* | 1/2008 | Kamigama | G11B 33/123 |
| | | | | 361/679.33 |
| 2008/0310048 | A1* | 12/2008 | Hirono | G11B 33/148 |
| | | | | 360/97.16 |
| 2019/0066716 | A1* | 2/2019 | Suzuki | G11B 5/10 |
| 2019/0074615 | A1* | 3/2019 | Okamoto | G11B 33/122 |
| 2020/0294546 | A1* | 9/2020 | Yamamoto | G11B 20/10 |

* cited by examiner

DISK DRIVE AND DISK DRIVE MANUFACTURING METHOD

CROSS-REFERENCE TO RELATED APPLICATIONS

This application is based upon and claims the benefit of priority from Japanese Patent Application No. 2022-148605, filed on Sep. 16, 2022, the entire contents of which are incorporated herein by reference.

FIELD

Embodiments described herein relate generally to a disk drive and a disk drive manufacturing method.

BACKGROUND

Disk drives such as a hard disk drive (HDD) typically include a housing that houses various kinds of parts and components including magnetic disks. The housing includes, for example, a base and an inner cover and an outer cover attached to the base. The housing is filled with a gas such as helium.

Gas filling into the housing may be performed two or more times, for example, after attaching the inner cover to the base and after attaching the outer cover to the base.

DETAILED DESCRIPTION

A disk drive according to an embodiment includes a magnetic disk, a housing, a seal, and a piercing member. The housing includes a base having a first space in which the magnetic disk is accommodated, a first cover with a first hole, attached to the base, and a second cover joined to the base so as to cover the first cover. The first cover is located between the second cover and the first space to close the first space. The first cover and the second cover are placed with a second space in-between. The first hole allows communication between the first space and the second space. The seal with a second hole, is attached to the first cover, the second hole allowing communication between the first space or the second space and the first hole. The piercing member includes an attachment part attached to the second cover in the second space, and a needle protruding from the attachment part toward the second hole.

First Embodiment

A first embodiment will be described below with reference to FIGS. 1 to 5. Note that, in some cases, a plurality of expressions is given for component elements according to the embodiments and for description of the component elements, in the present specification. The component elements and the description thereof are presented by way of example only and is not limited by the expressions in the present specification. The component elements can be identified by names different from those in the present specification as well. In addition, different expressions from those in the present specification can be given for the component elements.

Figure 1:
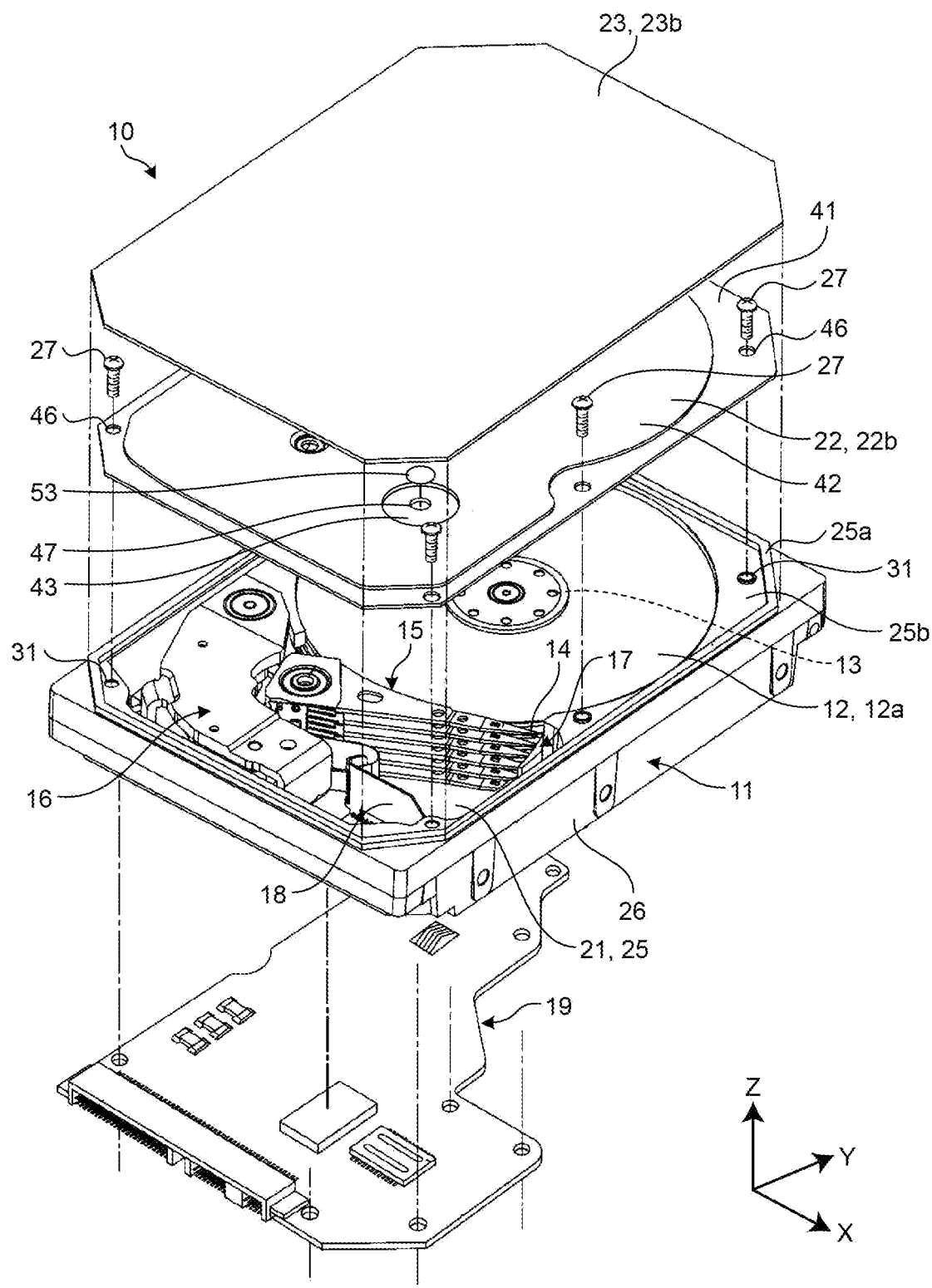
FIG. 1 is an exemplary perspective view illustrating an exploded view of a hard disk drive (HDD) according to a first embodiment.

FIG. 1 is an exemplary perspective view illustrating an exploded view of a hard disk drive (HDD) 10 according to the first embodiment. The HDD 10 is an example of a disk drive and may also be referred to as an electronic device, storage device, an external storage device, or magnetic disk drive.

As illustrated in the drawings, in the present specification, an X axis, a Y axis, and a Z axis are defined for convenience. The X axis, the Y axis, and the Z axis are orthogonal to each other. The X axis is provided along the width of the HDD 10. The Y axis is provided along the length of the HDD 10. The Z axis is provided along the thickness of the HDD 10.

Furthermore, in the present specification, an X direction, a Y direction, and a Z direction are defined. The X direction is a direction extending along the X axis and includes a +X direction that is a direction indicated by an arrow of the X axis and a −X direction that is a direction opposite to that of the arrow of the X axis. The Y direction is a direction along the Y axis, and includes a +Y direction that is a direction indicated by an arrow of the Y axis and a −Y direction that is a direction opposite to that of the arrow of the Y axis. The Z direction is a direction along the Z axis and includes a +Z direction that is a direction indicated by an arrow of the Z axis and a −Z direction that is a direction opposite to that of the arrow of the Z axis.

The HDD 10 includes a housing 11, a plurality of magnetic disks 12, a spindle motor 13, a plurality of magnetic heads 14, a head stack assembly (HSA) 15, a voice coil motor (VCM) 16, a ramp load mechanism 17, a flexible printed circuit (FPC) board 18, and a printed circuit board (PCB) 19. Each of the magnetic heads 14 may also be referred to as a slider.

The housing 11 includes a base 21, an inner cover 22, and an outer cover 23. The inner cover 22 is an example of a first cover. The outer cover 23 is an example of a second cover. The base 21, the inner cover 22, and the outer cover 23 are made of metal such as aluminum alloy or stainless steel. Note that the base 21, the inner cover 22, and the outer cover 23 may be made of another material.

The base 21 is a bottomed container and includes a bottom wall 25 and a side wall 26. The bottom wall 25 is formed into substantially a rectangular (square) plate shape extending along an X-Y plane. The side wall 26 protrudes from the edges of the bottom wall 25 substantially in the +Z direction.

The inner cover 22 is attached to an end of the side wall 26 in the +Z direction, for example, with screws 27. The outer cover 23 is hermetically joined to the end of the side wall 26 in the +Z direction to cover the inner cover 22, for example, by welding.

The inside of the housing 11 is sealed. The housing 11 internally includes the magnetic disks 12, the spindle motor 13, the magnetic heads 14, the HSA 15, the VCM 16, the ramp load mechanism 17, and the FPC 18.

Each of the magnetic disks 12 is, for example, a disk-form recording medium including magnetic recording layers formed on recording surfaces 12a such as upper and lower surfaces. In FIG. 1, the magnetic disk 12 has a diameter of, for example, 3.5 inches. The magnetic disk 12 is not limited to this example.

The spindle motor 13 supports and rotates the plurality of magnetic disks 12 that is stacked at intervals in the Z direction in which each of the recording surfaces 12a faces. The plurality of magnetic disks 12 is held on a hub of the spindle motor 13 by a clamp spring. The HDD 10 according to the present embodiment includes 10 magnetic disks 12 arranged in the Z direction. Note that the number of the magnetic disks 12 is not limited to this example.

The magnetic head 14 records and reproduces information, for each of the recording layers of each magnetic disk 12. In other words, the magnetic head 14 reads and writes information from and to the magnetic disk 12. The magnetic head 14 is mounted on the HSA 15.

The HSA 15 is rotatably attached to the base 21 apart from the magnetic disks 12 in a direction substantially orthogonal to the Z direction. The VCM 16 rotates the HSA 15 and positions the HSA 15 to a desired position. The ramp load mechanism 17 holds the magnetic heads 14 moved to the outermost periphery of the magnetic disks 12 at an unload position spaced apart from the magnetic disks 12.

The FPC 18 has one end that is connected to a flexure included in the HSA 15. The FPC 18 is electrically connected to each magnetic head 14 via the flexure. The FPC 18 has the other end that is connected to a connector provided on the bottom wall 25.

Outside the housing 11, the PCB 19 is attached to the outside of the bottom wall 25 of the base 21. Various electronic components, such as a relay connector connected to the connector at the bottom wall 25, an interface (I/F) connector connected to a host computer, and a controller controlling the operation of the HDD 10, are mounted on the PCB 19. The relay connector is electrically connected to the FPC 18 via the connector at the bottom wall 25.

Figure 2:
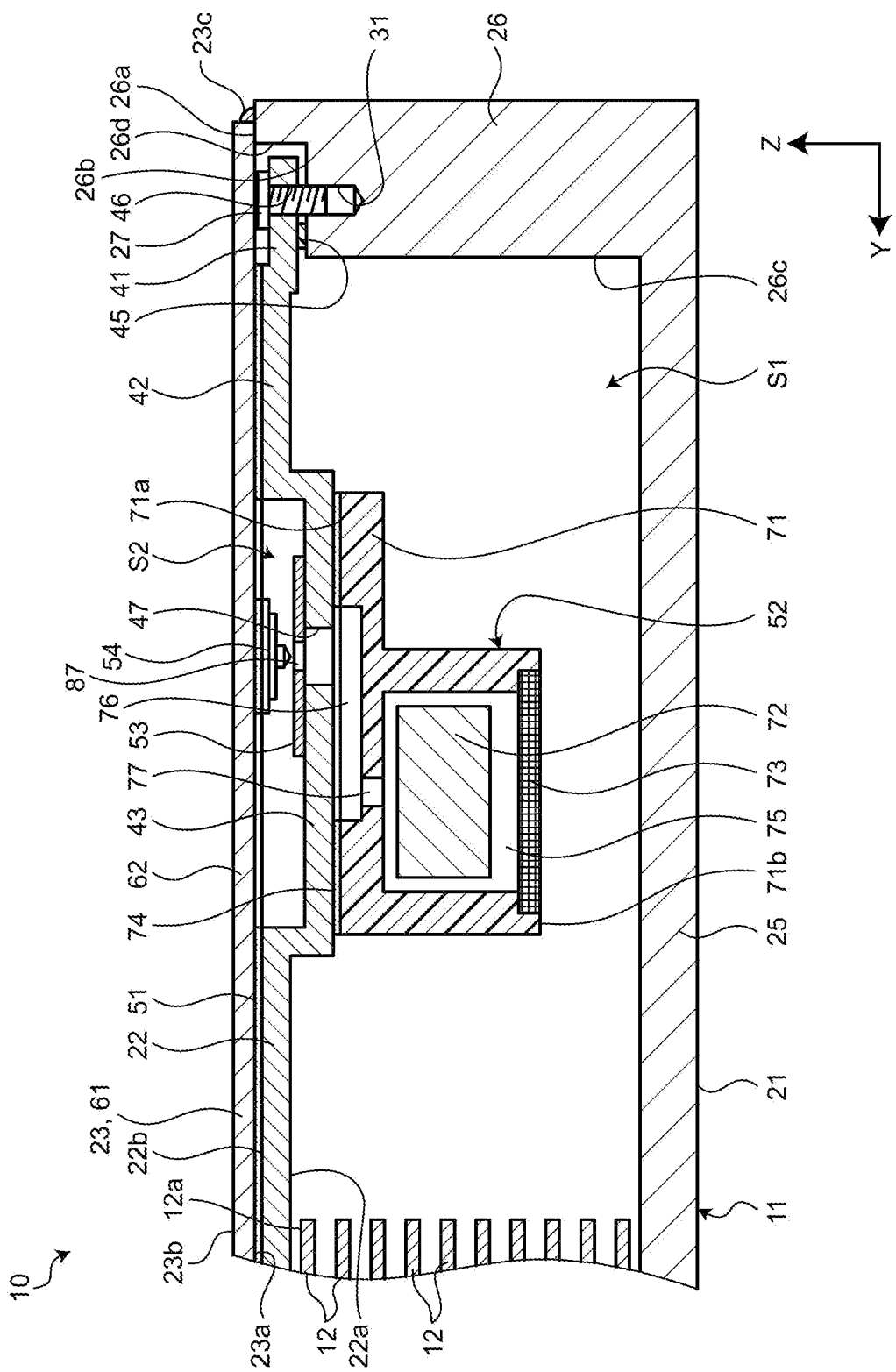
FIG. 2 is an exemplary cross-sectional view of a part of the HDD according to the first embodiment.

FIG. 2 is an exemplary cross-sectional view of a part of the HDD 10 according to the first embodiment. As illustrated in FIG. 2, the housing 11 has a space S1 inside. The space S1 is an example of a first space.

The base 21 has the space S1 inside. The space S1 is open outward the base 21 substantially in the +Z direction. The inner cover 22 attached to the base 21 closes the space S1. In other words, the space S1 is formed, defined, or partitioned by the base 21 and the inner cover 22.

The plurality of magnetic disks 12, the spindle motor 13, the plurality of magnetic heads 14, the HSA 15, the VCM 16, the ramp load mechanism 17, and the FPC 18 are accommodated in the space S1. Note that other components may be further accommodated in the space S1.

The side wall 26 of the base 21 has an end surface 26a, a clamping surface 26b, an inner surface 26c, and an intermediate surface 26d. The end surface 26a is at the end of the side wall 26 in the +Z direction. The end surface 26a is substantially flat and faces substantially in the +Z direction. The end surface 26a has a substantially rectangular annular shape. In other words, the end surface 26a has an endless form.

When projected in the Z direction, the clamping surface 26b is surrounded by the end surface 26a in a projection plane. In other words, when viewed in the Z direction, the clamping surface 26b is located inside the end surface 26a. The clamping surface 26b is in the vicinity of the end surface 26a and is closer to the bottom wall 25 than the end surface 26a in the Z direction. In other words, the clamping surface 26b is recessed substantially in the −Z direction from the end surface 26a.

The clamping surface 26b is substantially flat and faces substantially in the +Z direction. The clamping surface 26b has a substantially rectangular annular shape. Note that the clamping surface 26b is not limited to this example. The clamping surface 26b is provided with a plurality of screw holes 31.

The inner surface 26c is provided between an inside edge of the clamping surface 26b and the bottom wall 25. The inner surface 26c faces inward the space S1. The intermediate surface 26d is provided between an inside edge of the end surface 26a and an outside edge of the clamping surface 26b.

The inner cover 22 is positioned inside the intermediate surface 26d of the side wall 26. The inner cover 22 is spaced apart from the intermediate surface 26d. The inner cover 22 has an inner surface 22a and an outer surface 22b. The inner surface 22a faces the space S1 and faces the clamping surface 26b of the side wall 26. The outer surface 22b is opposite the inner surface 22a and faces the outer cover 23.

The inner cover 22 has an outer peripheral part 41, an inner peripheral part 42, and a recess 43. Each of the outer peripheral part 41, the inner peripheral part 42, and the recess 43 is part of the inner cover 22 having part of the inner surface 22a and part of the outer surface 22b.

The outer peripheral part 41 has, for example, an endless form along the clamping surface 26b of the side wall 26. The outer peripheral part 41 is supported by the clamping surface 26b of the side wall 26 via an endless gasket 45. The gasket 45 is made of, for example, synthetic rubber having low helium permeability. Note that the gasket 45 may be made of another material.

The outer peripheral part 41 is provided with a plurality of insertion holes 46. Each of the plurality of insertion holes 46 extends through the outer peripheral part 41 substantially in the Z direction and opens to the inner surface 22a and the outer surface 22b of the outer peripheral part 41. The screws 27 are fitted into the screw holes 31 in the side wall 26 through the insertion holes 46. Accordingly, the screws 27 detachably secure the inner cover 22 to the clamping surface 26b of the base 21. The gasket 45 is compressed between the clamping surface 26b of the side wall 26 and the inner surface 22a of the outer peripheral part 41, and hermetically seals a gap between the clamping surface 26b and the inner surface 22a.

The inner peripheral part 42 is connected to the outer peripheral part 41 inside the outer peripheral part 41. The outer surface 22b of the inner peripheral part 42 is closer to the outer cover 23 than the outer surface 22b of the outer peripheral part 41. The recess 43 is recessed from the inner peripheral part 42 substantially in the −Z direction. The outer surface 22b of the recess 43 is farther from the outer cover 23 than the outer surface 22b of the outer peripheral part 41, and is farther from the outer cover 23 than the outer surface 22b of the inner peripheral part 42.

The recess 43 is provided with a vent 47. The vent 47 extends through the recess 43 substantially in the Z direction and is open to the inner surface 22a and the outer surface 22b of the recess 43. The vent 47 thus communicates with the space S1.

The outer cover 23 has an inner surface 23a and an outer surface 23b. The inner surface 23a is substantially flat and faces substantially in the −Z direction. The inner surface 23a faces the end surface 26a of the side wall 26 and the outer surface 22b of the inner cover 22. The outer surface 23b is opposite the inner surface 23a. The outer surface 23b is substantially flat and faces substantially in the +Z direction.

The inner surface 23a of the outer cover 23 abuts on the end surface 26a of the side wall 26. The outer cover 23 is hermetically joined to the end surface 26a of the side wall 26, for example, by welding. Thus, the outer cover 23 is joined to the base 21 so as to cover the inner cover 22.

The outer cover 23 is joined to the endless end surface 26a over the entire circumference. A joint 23c between the welded outer cover 23 and side wall 26 generally seals a gap between the outer cover 23 and the side wall 26 more hermetically than the gasket 45.

The outer cover 23 is at least partially spaced apart from the inner cover 22. Namely, there is a small space S2 between the inner cover 22 and the outer cover 23. The small space S2 is an example of a second space. The inner cover 22 is located between the outer cover 23 and the space S1. The vent 47 in the inner cover 22 allows communication between the space S1 and the small space S2. In other words, the space S1 and the small space S2 are in communication with each other through the vent 47.

The joint 23c of the outer cover 23 is adjacent to the small space S2. The joint 23c seals a gap between the outer cover 23 and the end surface 26a of the side wall 26, the gap allowing communication between the small space S2 and the outside of the HDD 10.

The HDD 10 further includes a double-sided tape 51, a desiccant filter 52, a seal 53, and a piercing member 54. The desiccant filter 52 is an example of a filter.

The double-sided tape 51 is interposed between the outer surface 22b of the inner peripheral part 42 of the inner cover 22 and the inner surface 23a of the outer cover 23. The double-sided tape 51 fixes outer cover 23 to the inner peripheral part 42 of the inner cover 22. Furthermore, the double-sided tape 51 seals a gap between the inner peripheral part 42 of the inner cover 22 and the outer cover 23. In other words, the double-sided tape 51 fills part of the small space S2 and reduces the volume of the small space S2. Note that the outer cover 23 may be mounted to the inner cover 22 with an adhesive, instead of the double-sided tape 51.

The outer cover 23 includes a stationary part 61 and a movable part 62. The stationary part 61 and the movable part 62 are a part of the inner cover 22 having part of the inner surface 23a and part of the outer surface 23b of the outer cover 23.

The stationary part 61 is part of the outer cover 23 and fixed to the inner cover 22 with the double-sided tape 51. The movable part 62 is part of the outer cover 23 and surrounded by the stationary part 61. The movable part 62 is not fixed to the inner cover 22 with the double-sided tape 51 but spaced apart from the inner cover 22. The inner surface 23a of the movable part 62 faces the outer surface 22b of the recess 43 of the inner cover 22 with spacing.

The desiccant filter 52 is placed in the space S1. The desiccant filter 52 includes a case 71, a desiccant 72, a collection member 73, and a double-sided tape 74. Note that the desiccant filter 52 is not limited to this example.

The case 71 has an upper surface 71a and a lower surface 71b. Note that in the present embodiment the terms "upper" and "lower" are defined with reference to the arrangement of the HDD 10 in FIG. 2 for convenience purpose only, and are not intended to limit positions or locations, directions, usage modes, and else.

The upper surface 71a is substantially flat and faces substantially in the +Z direction. The upper surface 71a faces the inner surface 22a of the recess 43 of the inner cover 22. The lower surface 71b is opposite the upper surface 71a. The lower surface 71b is substantially flat and faces substantially in the −Z direction. The lower surface 71b faces the bottom wall 25 with spacing.

The case 71 is provided with a desiccant chamber 75, a flow path 76, and a connection hole 77. The desiccant chamber 75 is a bottomed hole provided in the lower surface 71b of the case 71. The desiccant chamber 75 communicates with the space S1. The flow path 76 is a groove that is provided in the upper surface 71a and extending substantially in the Y direction. The connection hole 77 communicates between the desiccant chamber 75 and the flow path 76. In a direction orthogonal to the Z direction, the connection hole 77 is spaced apart from the vent 47.

The desiccant 72 is made of, for example, a material, such as silica gel, capable of absorbing moisture in a gas. The desiccant 72 is housed in the desiccant chamber 75. The collection member 73 is a filter capable of collecting dust. The collection member 73 closes the desiccant chamber 75 so as to pass the gas. The desiccant 72 is positioned between the collection member 73 and the connection hole 77, in the desiccant chamber 75.

The double-sided tape 74 works to adhere the upper surface 71a of the case 71 to the inner surface 22a of the recess 43 in the inner cover 22. Thereby, the desiccant filter 52 is attached to the inner cover 22. The desiccant filter 52 covers the vent 47 in such a manner that the vent 47 and the connection hole 77 can be in communication with each other through the flow path 76.

The seal 53 is located in the small space S2. The seal 53 may be located in the space S1. The seal 53 is attached to the inner cover 22 so as to partially cover the vent 47 or surround the vent 47.

Figure 3:
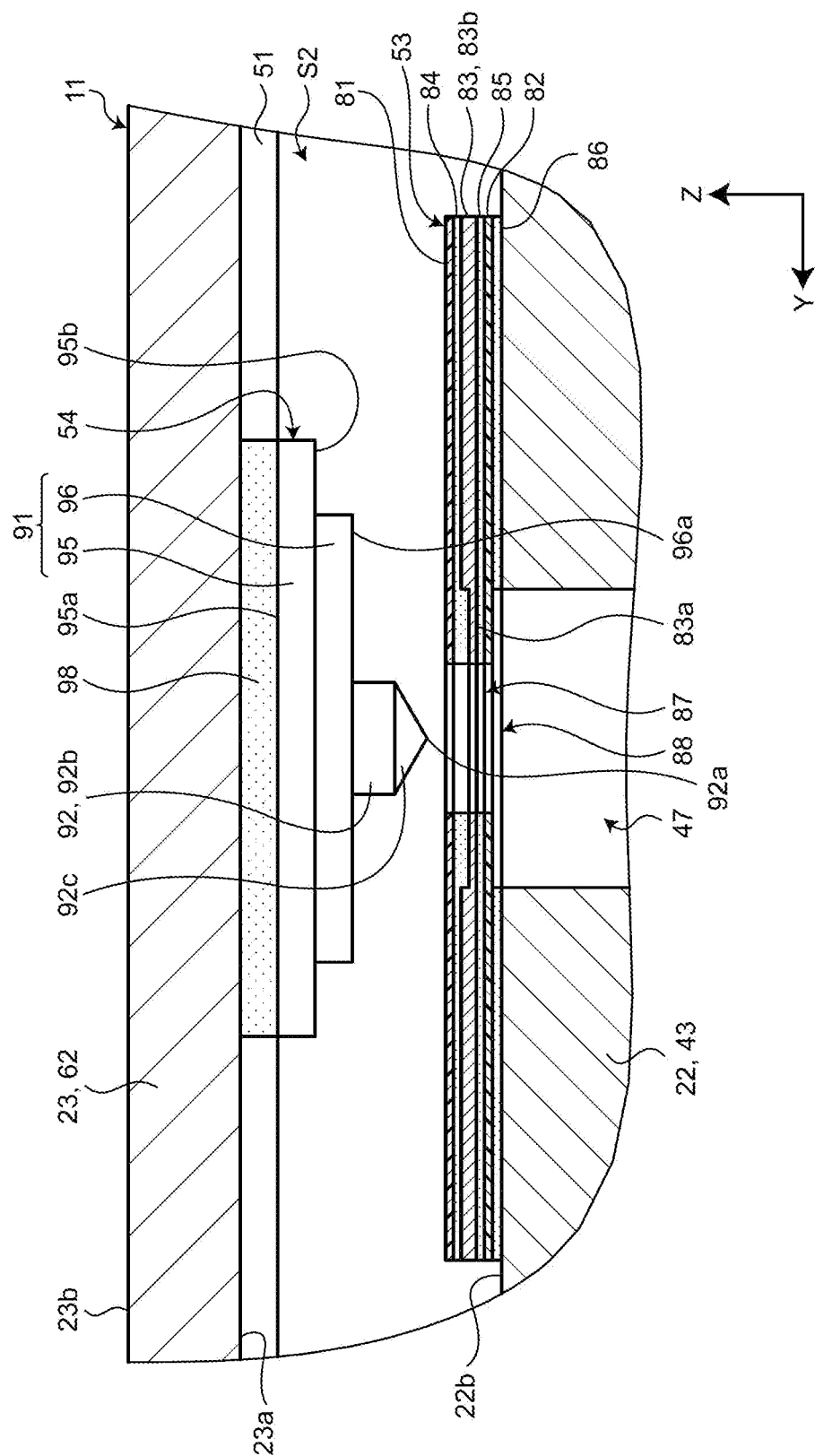
FIG. 3 is an exemplary cross-sectional view of a seal and a piercing member according to the first embodiment.

FIG. 3 is an exemplary cross-sectional view of the seal 53 and the piercing member 54 according to the first embodiment. As illustrated in FIG. 3, the seal 53 includes, for example, two resin layers 81 and 82, a metal layer 83, and three adhesive layers 84, 85, and 86. Note that the seal 53 is not limited to this example.

The resin layers 81 and 82 are made of, for example, a synthetic resin such as polyethylene terephthalate (PET). Each of the resin layers 81 and 82 is has a sheet-like shape extending along the X-Y plane. The two resin layers 81 and 82 are separated from each other substantially in the Z direction.

The metal layer 83 is made of, for example, metal such as aluminum. The metal layer 83 has a sheet-like shape extending along the X-Y plane. The metal layer 83 is positioned between the two resin layers 81 and 82. The resin layers 81 and 82 work to avoid oxidation of the metal layer 83.

The metal layer 83 includes a small-thickness part 83a and a large-thickness part 83b. The small-thickness part 83a is an example of a first part. The large-thickness part 83b is an example of a second part. The small-thickness part 83a is substantially at the center of the metal layer 83 in a direction along the X-Y plane. The large-thickness part 83b surrounds the small-thickness part 83a. The large-thickness part 83b is thicker than the small-thickness part 83a. Note that the metal layer 83 may have a substantially uniform thickness.

The adhesive layer 84 lies between the resin layer 81 and the metal layer 83 to bond the resin layer 81 and the metal layer 83 together. The adhesive layer 85 lies between the resin layer 82 and the metal layer 83 to bond the resin layer 82 and the metal layer 83 together.

The adhesive layer 86 is adhered to the resin layer 82 and to the outer surface 22b of the recess 43 in the inner cover 22. In other words, the adhesive layer 86 is located between the metal layer 83 and the inner cover 22. Thereby, the seal 53 is attached to the outer surface 22b of the inner cover 22.

The seal 53 is provided with a hole 87. The hole 87 is an example of a second hole. The hole 87 extends through the seal 53 substantially in the Z direction and allows the small space S2 and the vent 47 to communicate with each other. When the seal 53 is located in the space S1, the hole 87 allows communication between the space S1 and the vent 47. The hole 87 is located at about the center of the seal 53. For this reason, the hole 87 is formed in the small-thickness part 83a of the metal layer 83.

In the present embodiment, the diameter of the hole 87 is smaller than the diameter of the vent 47. Therefore, the seal 53 covers part of the vent 47. Note that the diameter of the hole 87 may be equal to or larger than the diameter of the vent 47. In this configuration, the seal 53 does not cover the vent 47 but surrounds the vent 47.

The adhesive layer 86 is provided with a removal hole 88. The removal hole 88 is an example of a third hole. The removal hole 88 extends through about the center of the adhesive layer 86 substantially in the Z direction. In other words, the removal hole 88 is a portion of the seal 53 including no adhesive layer 86. The removal hole 88 exposes part of the resin layer 82.

The removal hole 88 communicates with the vent 47 and the hole 87. Thus, the hole 87 communicates with the vent 47 through the removal hole 88. Note that the adhesive layer 86 may not be provided with the removal hole 88, and the hole 87 may extend through the adhesive layer 86 instead.

The space S1 communicates with the small space S2 through the desiccant filter 52, the vent 47, the removal hole 88, and the hole 87. In other words, the gas inside the housing 11 is movable between the space S1 and the small space S2.

The inside of the housing 11, including the space S1 and the small space S2, is filled with a gas that is different from air. The gas filling inside the housing 11 is, for example, a low density gas having a density lower than that of air, an inert gas of low reactivity, or the like. For example, the housing 11 is filled with helium. Note that the housing 11 may be filled with another gas.

In the present embodiment, an extremely small amount of air or molecules constituting air such as nitrogen and oxygen are present inside the housing 11. However, the amount of helium is larger than the amount of air inside the housing 11.

The piercing member 54 is attached to the outer cover 23 in the small space S2. The piercing member 54 includes an attachment part 91 and a needle 92. The attachment part 91 and the needle 92 are integrated together. However, the attachment part 91 and the needle 92 may be different components.

The attachment part 91 includes a seat 95 and a step 96. The seat 95 has a substantially disk shape extending along the X-Y plane. Note that the shape of the seat 95 is not limited to this example. The seat 95 has an upper surface 95a and a lower surface 95b.

The upper surface 95a is substantially flat and faces substantially in the +Z direction. The upper surface 95a faces the inner surface 23a of the outer cover 23. The lower surface 95b is opposite the upper surface 95a. The lower surface 95b is substantially flat and faces substantially in the −Z direction.

The upper surface 95a is attached to the inner surface 23a of the movable part 62 of the outer cover 23, for example, with a double-sided tape 98. In other words, the attachment part 91 of the piercing member 54 is attached to the movable part 62 of the outer cover 23 in the small space S2.

The step 96 protrudes substantially in the −Z direction from the lower surface 95b of the seat 95. The step 96 has, for example, a substantially columnar shape extending substantially in the Z direction. Note that the shape of the step 96 is not limited to this example. The step 96 includes an abutment surface 96a.

The abutment surface 96a is located at an end of the step 96 in the −Z direction. The abutment surface 96a is substantially flat and faces substantially in the −Z direction. The abutment surface 96a faces the outer surface 22b of the recess 43 of the inner cover 22, the vent 47, and the seal 53 with spacing.

The diameter of the abutment surface 96a that is a substantially circular flat surface is larger than the diameter of the vent 47. Therefore, at least part of the abutment surface 96a faces the outer surface 22b of the inner cover 22, for example, via the seal 53.

The needle 92 protrudes substantially in the −Z direction, from the abutment surface 96a of the step 96. The length of the needle 92 in the Z direction is longer than the length of the hole 87 in the Z direction. For example, the length of the needle 92 in the Z direction is set to a value of the sum of the thickness of the seal 53 and the maximum value of dimensional tolerance of the needle 92. In other words, the length of the needle 92 in the Z direction is set so that the needle 92 is capable of penetrating the seal 53.

In the present embodiment, the axis of the vent 47, the axis of the attachment part 91, and the axis of the needle 92 substantially coincide with one another. Because of this, the needle 92 protrudes from the attachment part 91 toward the vent 47. In other words, the needle 92 has a tip 92a facing the vent 47.

The needle 92 includes a columnar part 92b and a conical part 92c. The columnar part 92b has a substantially columnar shape, and extends substantially in the −Z direction from the abutment surface 96a of the step 96. The conical part 92c is at an end of the columnar part 92b in the −Z direction. The conical part 92c has a conical, tapered shape substantially in the −Z direction. The tip 92a is positioned at an end of the conical part 92c in the −Z direction. Note that the needle 92 is not limited to this example.

The diameter of the columnar part 92b and the maximum diameter of the conical part 92c are smaller than the diameter of the vent 47. Because of this, when projected in the Z direction, the needle 92 has a smaller projection plane than the vent 47. The projection plane of the needle 92 projected in the Z direction is smaller than a projection plane of the small-thickness part 83a and a projection plane of the removal hole 88.

The needle 92 is spaced apart from the seal 53 substantially in the +Z direction outside the hole 87. Note that the tip 92a of the needle 92 may be positioned inside the hole 87. However, the needle 92 is spaced apart from the seal 53 without making contact with the seal 53.

The piercing member 54 is made of a metal such as stainless steel or aluminum alloy. The needle 92 is made of a metal. Furthermore, the Vickers hardness of the metal layer 83 of the seal 53 is equal to or less than the Vickers hardness of the needle 92.

Hereinafter, part of a manufacturing method of the HDD 10 will be described as an example. This exemplary method is presented for illustrative purpose only, and another method may be adoptable. First, the plurality of magnetic disks 12, the spindle motor 13, the plurality of magnetic heads 14, the HSA 15, the VCM 16, the ramp load mechanism 17, and the FPC 18 are placed in the space S1 inside the base 21. The magnetic disks 12, the spindle motor 13, the magnetic heads 14, the HSA 15, the VCM 16, the ramp load mechanism 17, the FPC 18, and the PCB 19 are assembled to be operable as the HDD 10.

Next, the inner cover 22 with the desiccant filter 52 attached is attached to the base 21 with the screws 27. Thus, the space S1 is closed by the inner cover 22. However, the space S1 can be in communication with the outside through the desiccant filter 52 and the vent 47.

Next, inside air is removed from the space S1 through the desiccant filter 52 and the vent 47. The space S1 is then filled with helium through the vent 47 and the desiccant filter 52. Alternatively, the air may be removed from the space S1 by filling the space S1 with helium.

Next, the seal 53 is attached to the inner cover 22. Thus, the vent 47 is sealed by the seal 53. The vent 47 is hermetically sealed by the seal 53. The gap between the base 21 and the inner cover 22 is also hermetically sealed by the gasket 45. This can prevent leakage of helium from the space S1 at least temporarily.

Next, operations of the HDD 10 are tested. For example, supplied with power through an I/F connector of the PCB 19, the HDD 10 performs normal write and read operations or a pre-stored test operation. Note that the operational test of the HDD 10 is not limited to this example.

When the test results in a failure, the HDD 10 can be repaired. For example, the inner cover 22 is detached from the base 21 to repair a component contained in the space S1. The inner cover 22 is readily detached from the base 21 by removing the screws 27.

Figure 4:
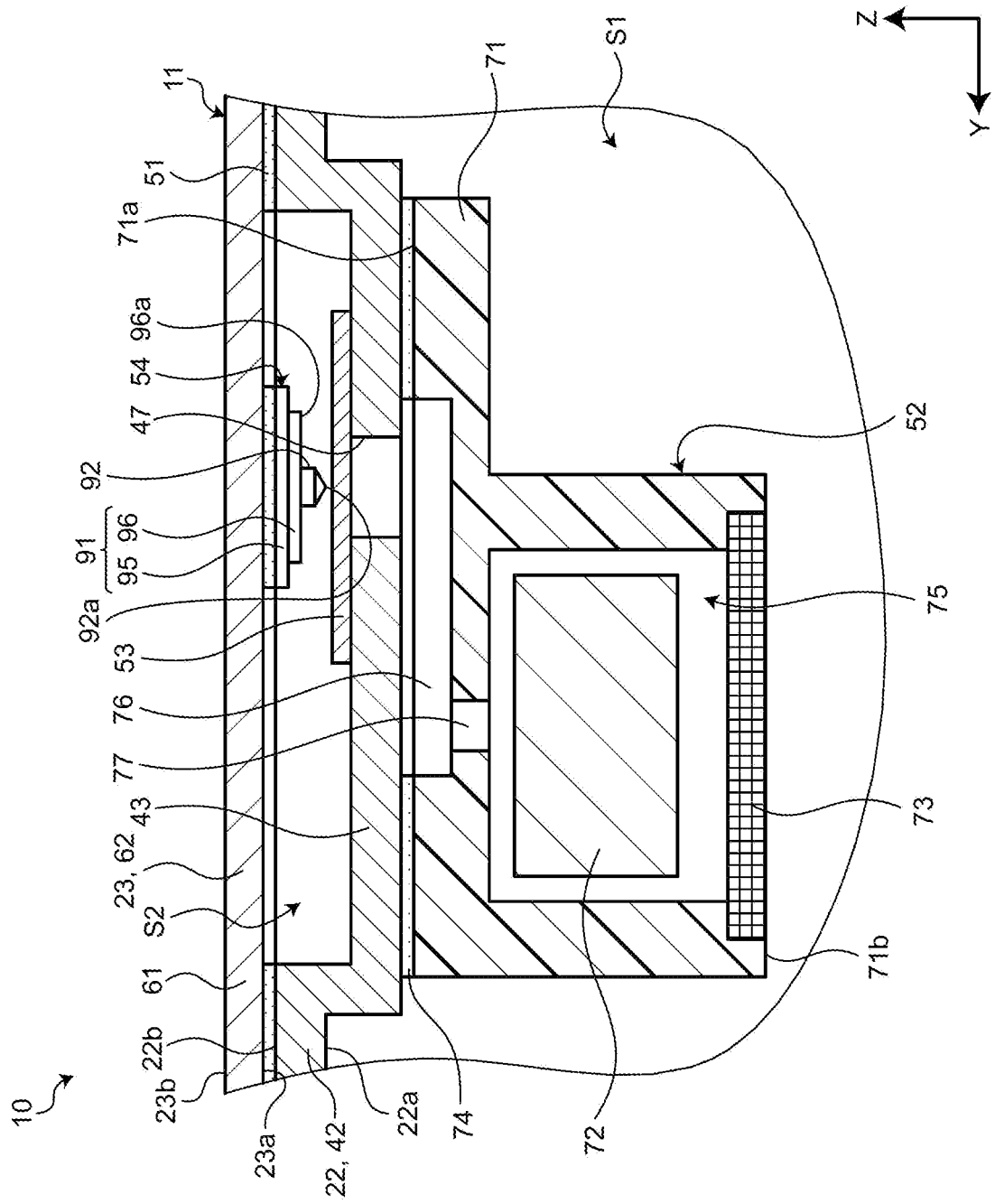
FIG. 4 is an exemplary cross-sectional view of an outer cover attached to an inner cover according to the first embodiment.

FIG. 4 is an exemplary cross-sectional view of the outer cover 23 attached to the inner cover 22 according to the first embodiment. As illustrated in FIG. 4, when the test results in success, the outer cover 23 to which the piercing member 54 is mounted is mounted to the inner cover 22 with the double-sided tape 51.

When the outer cover 23 is attached to the inner cover 22, the needle 92 is spaced apart from the seal 53. Note that when the outer cover 23 is attached to the inner cover 22, the tip 92a of the needle 92 may stick in the seal 53. However, the needle 92 does not penetrate the seal 53. Therefore, the seal 53 keeps sealing the vent 47.

Next, the outer cover 23 is joined to the end surface 26a of the side wall 26 of the base 21, for example, by welding. Thereby, the outer cover 23 covering the inner cover 22 is fixed to the base 21. The gap between the outer cover 23 and the end surface 26a of the side wall 26 is hermetically sealed by the joint 23c.

Joining the outer cover 23 to the base 21 forms the small space S2 between the inner cover 22 and the outer cover 23. The small amount of air is present in the small space S2. Note that, for example, a shielding gas used for welding may be present in the small space S2.

Figure 5:
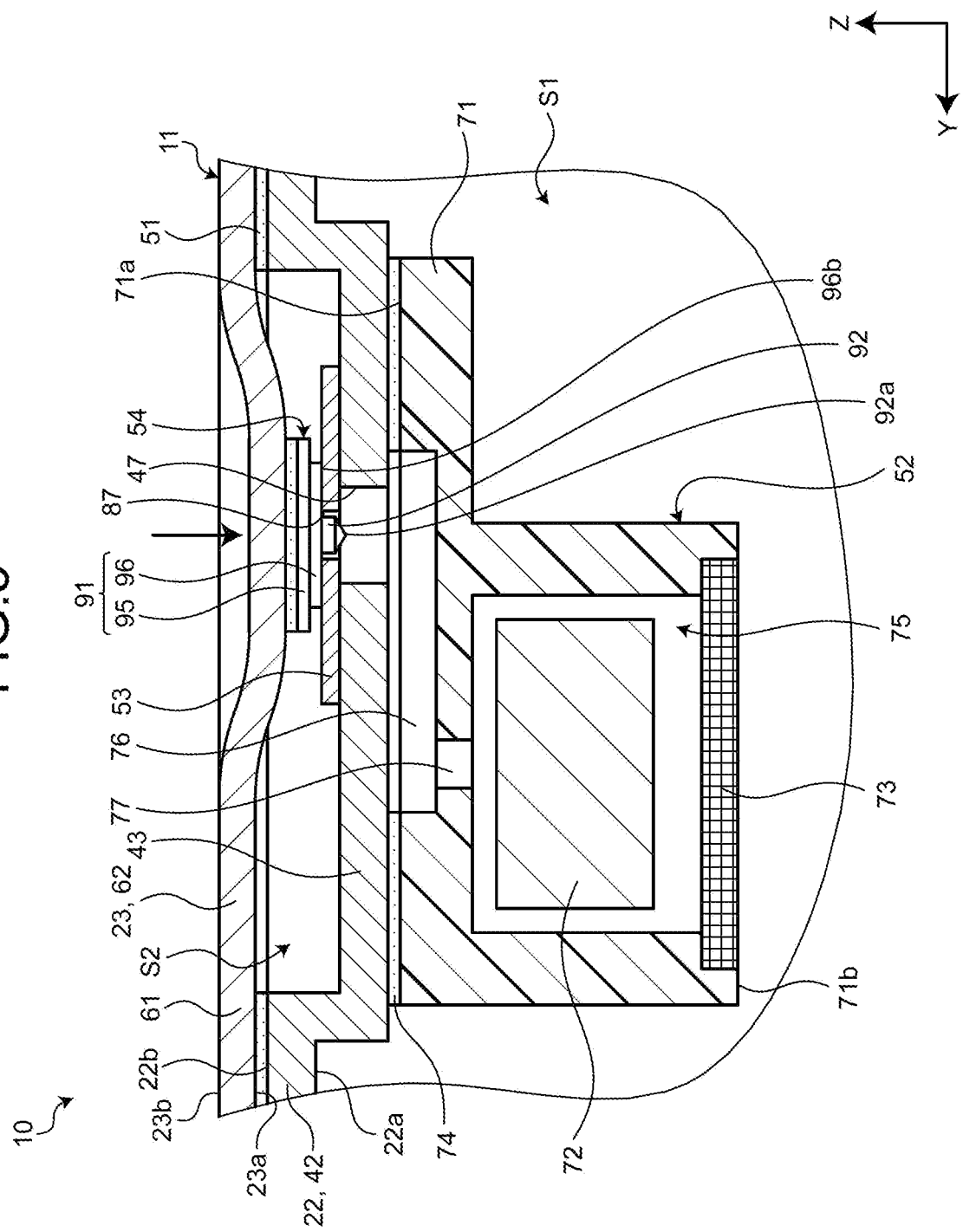
FIG. 5 is an exemplary cross-sectional view of the piercing member piercing the seal according to the first embodiment.

FIG. 5 is an exemplary cross-sectional view of the piercing member 54 piercing the seal 53 according to the first embodiment. As illustrated in FIG. 5, next, for example, a tool outside the housing 11 applies a load to the movable part 62 of the outer cover 23, in substantially in the −Z direction. Therefore, the movable part 62 is pressed substantially in the −Z direction and elastically deformed.

The movable part 62 is not fixed to the inner cover 22 and is spaced apart from the inner cover 22. Therefore, the movable part 62 to which the piercing member 54 is mounted is deformable so as to move the piercing member 54 substantially in the Z direction.

Being pressed substantially in the −Z direction, the movable part 62 is deformed to approach the vent 47 and the seal 53. This causes the piercing member 54 to approach the seal 53 and the needle 92 to pierce the seal 53 and form the hole 87 in the seal 53.

The needle 92 penetrates the small-thickness part 83a of the seal 53. The needle 92 can readily penetrate the metal layer 83 as compared with penetrating the large-thickness part 83b. Furthermore, the needle 92 passes through the removal hole 88 in the adhesive layer 86. The needle 92 can readily penetrate the seal 53 as compared with penetrating the adhesive layer 86.

When the needle 92 penetrates the seal 53, the abutment surface 96a of the attachment part 91 abuts on the outer surface 22b of the recess 43 in the inner cover 22 or the seal 53. In the present embodiment, the abutment surface 96a abuts on the seal 53 and is supported by the outer surface 22b via the seal 53. Thereby, the abutment surface 96a restricts the movable part 62 from further deforming and the piercing member 54 from further moving in the −Z direction.

At the time when the abutment surface 96a abuts on the inner cover 22 or the seal 53, the tip 92a of the needle 92 is located inside the vent 47. In other words, the needle 92 does not penetrate the vent 47. Note that the needle 92 may penetrate the vent 47, and the tip 92a may be located in the flow path 76 of the desiccant filter 52.

Next, the load acting on the movable part 62 is released. Therefore, the deformation of the movable part 62 is released, and the needle 92 is removed from the hole 87 of the seal 53. The hole 87 from which the needle 92 has been removed communicates between the space S1 and the small space S2. Therefore, helium flows into the small space S2 from the space S1.

On the other hand, the small amount of air flows into the space S1 from the small space S2. In some cases, the air may carry fragments of the seal 53 generated upon piercing the seal 53 by the needle 92, toward the space S1. However, the small amount of air passes through the collection member 73 of the desiccant filter 52. Therefore, the collection member 73 collects the fragments of the seal 53, preventing the fragments from entering the space S1.

Next, a helium leak inspection of the HDD 10 is conducted. For example, after air is removed from a chamber in which the HDD 10 is housed, the chamber is inspected for finding whether it contains helium.

In general, poor welding of the outer cover 23 may cause leakage of a gas from the small space S2 through the joint 23c of the outer cover 23. For example, if the space S1 and the small space S2 are not in communication with each other, air exists in the small space S2 but almost no helium does therein. In this case, the gas leaking from the joint 23c is the air. Because of this, there may be a possibility to detect no helium through the inspection, resulting in failing in detecting the poor welding of the outer cover 23.

Meanwhile, in the HDD 10 of the present embodiment, the space S1 and the small space S2 communicate with each other through the vent 47 of the inner cover 22 and the hole 87 of the seal 53. Thus, if the outer cover 23 is poorly welded, the helium leaks from the small space S2 through the joint 23c and can be detected by the inspection.

The HDD from which the leakage of helium has been detected 10 can be repaired or discarded as a defective product. With no leakage of helium detected and the inspection resulting in a pass, the manufacture of the HDD 10 is completed.

In the HDD 10 according to the first embodiment described above, the housing 11 includes the base 21 having the space S1, the inner cover 22 attached to the base 21, and the outer cover 23 joined to the base 21 to cover the inner cover 22. The magnetic disks 12 are housed in the space S1. The inner cover 22 is located between the outer cover 23 and the space S1 to close the space S1. The inner cover 22 and the outer cover 23 are placed with the small space S2 in-between. The inner cover 22 is provided with the vent 47 that allows communication between the space S1 and the small space S2. The seal 53 attached to the inner cover 22 is provided with the hole 87 that allows communication between the space S1 or the small space S2 and the vent 47. The piercing member 54 includes the attachment part 91 and the needle 92. The attachment part 91 is attached to the outer cover 23 in the small space S2. The needle 92 protrudes from the attachment part 91 toward the hole 87. In other words, the piercing member 54 attached to the outer cover 23 in the small space S2 includes the needle 92 that forms the hole 87 in the seal 53.

The HDD 10 including the piercing member 54 can be assembled in, for example, the following manner. First, the magnetic disks 12 are placed in the space S1. Next, the inner cover 22 is attached to the base 21 to close the space S1. The space S1 is then filled with gas different from air through the vent 47. Next, the seal 53 is attached to the inner cover 22 to seal the vent 47. Next, an operational test of the HDD 10 is conducted. According to a result of the test, the inner cover 22 may be removed from the base 21 to allow repair of a component or components contained in the space S1. Next, the outer cover 23 is joined to the base 21 to cover the inner cover 22. Next, the outer cover 23 is deformed so that the needle 92 of the piercing member 54 pierces the seal 53 to form the hole 87 in the seal 53. Thereby, the gas flows from the space S1 into the small space S2 through the vent 47 and the hole 87. In other words, the gas is contained not only in the space S1 but also in the small space S2 adjacent to the joint 23c between the base 21 and the outer cover 23. This enables a gas leak inspection of the joint 23c.

According to a conventional method, for example, the seal 53 is detached from the inner cover 22 after the operational test of the HDD 10. After the outer cover 23 is joined to the base 21, the space S1 is filled with the gas again through a hole in the outer cover 23 and the vent 47, and then the hole in the outer cover 23 is sealed by another seal. As such, in the conventional HDD 10, the seal 53 is detached once and the space S1 is filled with the gas twice or more. Meanwhile, in the HDD 10 of the present embodiment, filling the space S1 with the gas once is sufficient to allow a gas leak inspection of the joint 23c. In other words, the HDD 10 of the present embodiment enables decrease in the frequency of gas filling into the space S1, leading to facilitating the manufacture of the HDD 10. Furthermore, the HDD 10 of the present embodiment enables decrease in the number of times at which the seal 53 is attached and detached, leading to facilitating the manufacture of the HDD 10 and achieving cost reduction.

The needle 92 is made of metal. Thus, the needle 92 can easily form the hole 87 in the seal 53.

The seal 53 includes the metal layer 83 and the adhesive layer 86. The adhesive layer 86 is located between the metal layer 83 and the inner cover 22 and attached to the inner cover 22. The metal layer 83 is typically more difficult to pass gas therethrough than synthetic resin and fiber. Because of this, the seal 53 can seal the vent 47 more hermetically.

The Vickers hardness of the metal layer 83 is equal to or less than the Vickers hardness of the needle 92. Thus, the needle 92 can easily form the hole 87 in the seal 53.

The metal layer 83 includes the small-thickness part 83a with the hole 87, and the large-thickness part 83b thicker than the small-thickness part 83a and surrounding the small-thickness part 83a. In other words, of the metal layer 83, a portion to be pierced by the needle 92 is thinner in thickness than the rest, which makes it easier for the needle 92 to form the hole 87 in the seal 53.

The adhesive layer 86 is provided with the removal hole 88 communicating with the vent 47. In other words, the removal hole 88 is formed by removing part of the adhesive layer 86. This leads to cost reduction related to the seal 53 in the HDD 10. Furthermore, the removal hole 88 can decrease the thickness of a part of the seal 53. Thus, the needle 92 can readily form the hole 87 in the seal 53.

The desiccant filter 52 is attached to the inner cover 22 in the space S1 to cover the vent 47. The seal 53 is located in the small space S2. Because of this, the desiccant filter 52 is able to catch the fragments of the seal 53 arising from the needle 92's forming the hole 87 in the seal 53. In other words, the desiccant filter 52 can avoid the fragments of the seal 53 from contaminating the space S1 where the magnetic disks 12 are accommodated.

The piercing member 54 includes the abutment surface 96a facing the inner cover 22. When the abutment surface 96a abuts on the inner cover 22 or the seal 53 located in the small space S2, the tip 92a of the needle 92 is located inside the hole 87. As described above, the outer cover 23 is deformed to allow the needle 92 of the piercing member 54 to pierce the seal 53 and form the hole 87 in the seal 53. The abutment surface 96a works to restrict further deformation of the outer cover 23 by the abutment on the inner cover 22 or the seal 53. Meanwhile, the tip 92a of the needle 92 does not completely pass through the vent 47 but remains inside the vent 47. In this manner the HDD 10 of the present embodiment enables the work of forming the hole 87 with the needle 92 to be ensured and can avoid damaging a component or components such as the desiccant filter 52 in the space S1, which may otherwise occur due to the needle 92 entering the space S1.

When projected in the Z direction in which the vent 47 extends through the inner cover 22, the needle 92 has a smaller projection plane than the vent 47. This lowers the possibility for the needle 92, when piercing the seal 53, to interfere with the inner cover 22.

The outer cover 23 includes the stationary part 61 fixed to the inner cover 22, and the movable part 62 spaced apart from the inner cover 22 and to which the piercing member 54 is attached. The movable part 62 is deformable to approach the vent 47. Thus, along with the deformation of the movable part 62, the needle 92 of the piercing member 54 pierces the seal 53 to form the hole 87 in the seal 53. Furthermore, fixing the stationary part 61 to the inner cover 22 can decrease the volume of the small space S2. In this manner, the HDD 10 of the present embodiment makes it possible to decrease the amount of airflow into the space S1 from the small space S2.

Furthermore, the space S1 is filled with the gas different from air. Thereby, depending on the characteristics of the gas, the HDD 10 of the present embodiment can decrease, for example, the vibration of the magnetic disks 12 due to airflow, and the power consumption of the spindle motor that rotates the magnetic disks 12.

The gas inside the space S1 contains helium. The helium has a lower density than air. Because of this, the HDD 10 of the present embodiment can decrease, for example, the vibration of the magnetic disks 12 due to wind, and the power consumption of the spindle motor that rotates the magnetic disks 12.

Second Embodiment

A second embodiment will be described below with reference to FIG. 6. Note that in the following description of the embodiment, component elements having functions similar to those of the component elements having been described are denoted by the same reference numerals and symbols as those of the component elements having been descried above, and the description thereof may be omitted. In addition, a plurality of the component elements denoted by the same reference numerals and symbols does not necessarily have all the functions and properties in common, and may have different functions and properties according to each embodiment.

Figure 6:
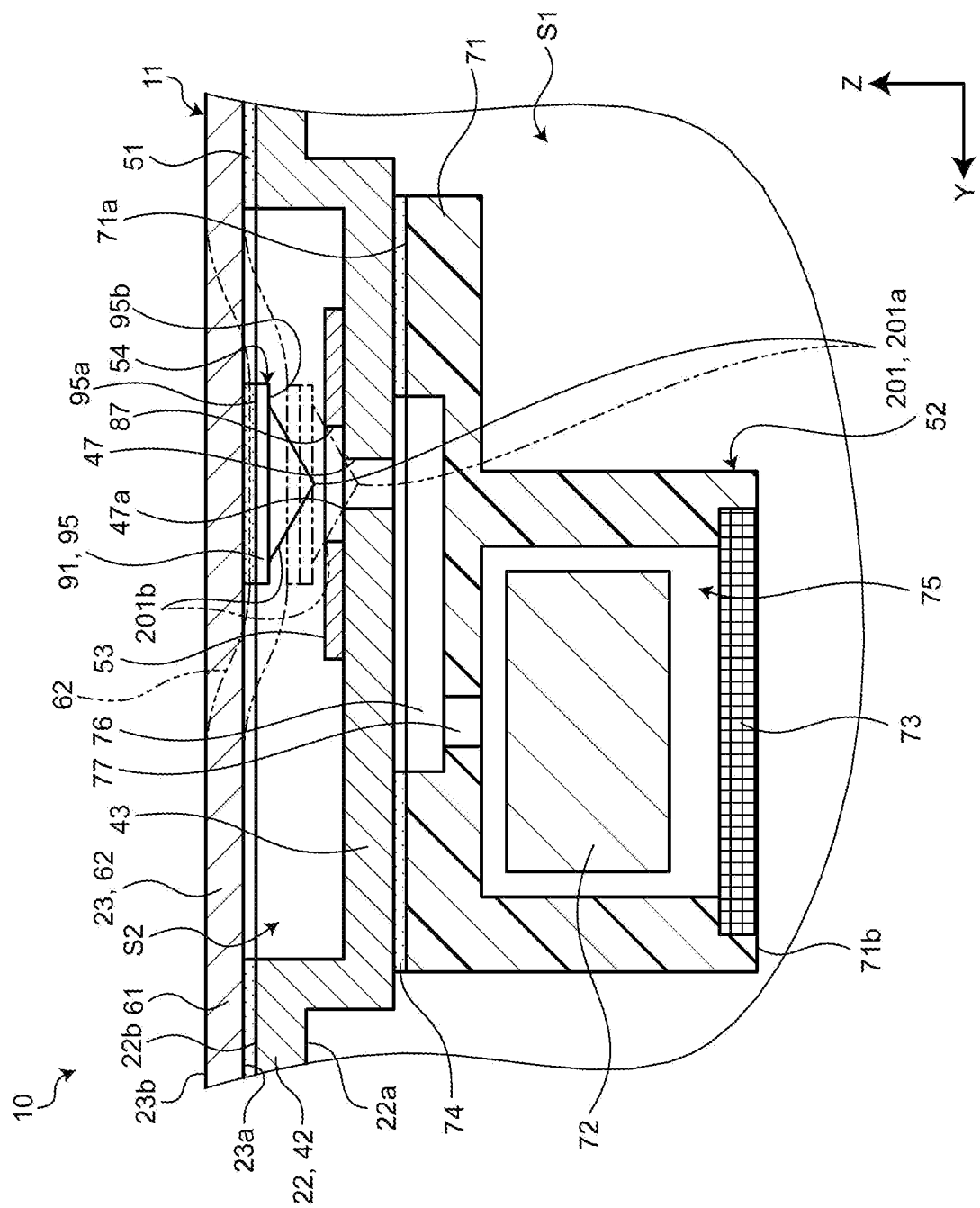
FIG. 6 is an exemplary cross-sectional view of a part of an HDD according to a second embodiment.

FIG. 6 is an exemplary cross-sectional view of a part of the HDD 10 according to the second embodiment. As illustrated in FIG. 6, the attachment part 91 of the second embodiment includes the seat 95 and does not include the step 96. Note that the attachment part 91 of the second embodiment may include the step 96.

The piercing member 54 of the second embodiment includes a needle 201 instead of the needle 92. The needle 201 is substantially the same as the needle 92 of the first embodiment except for the following points. The needle 201 of the second embodiment has a substantially conical shape and protrudes substantially in the −Z direction from the lower surface 95b of the seat 95 of the attachment part 91. The needle 201 includes a tip 201a that faces the vent 47. The needle 201 has a conical surface 201b.

The conical surface 201b is an outer surface of the conical needle 201. The tip 201a is at an end of the conical surface 201b in the −Z direction. The largest diameter of the conical surface 201b is larger than the diameter of the vent 47. Note that the conical surface 201b is not limited to this example.

In FIG. 6, as represented by a long dashed double-dotted line, the movable part 62 is pressed substantially in the −Z direction during the manufacture of the HDD 10. The movable part 62 is then deformed so as to approach the vent 47 and the seal 53, causing the needle 201 to pierce the seal 53. When the needle 201 penetrates the seal 53, the hole 87 is formed in the seal 53. In the second embodiment, the diameter of the hole 87 is equal to or larger than the diameter of the vent 47.

When the needle 201 penetrates the seal 53, the conical surface 201b of the needle 201 abuts on an edge 47a of the vent 47 in the +Z direction. The substantially entire circumference of the conical surface 201b is supported by the edge 47a. Thereby, the conical surface 201b restricts the movable part 62 from further deforming and the piercing member 54 from further moving in the −Z direction.

When the conical surface 201b abuts on the edge 47a of the vent 47, the tip 201a of the needle 201 is located inside the vent 47. In other words, the needle 201 does not penetrate the vent 47. Alternatively, the needle 201 may penetrate the vent 47, and the tip 201a may be located in the flow path 76 of the desiccant filter 52.

In the HDD 10 of the second embodiment as described above, when the needle 201 abuts on the edge 47a of the vent 47, the tip 201a of the needle 201 is located inside the vent 47. As described above, along with the deformation of the outer cover 23, the needle 201 of the piercing member 54 pierces the seal 53 and forms the hole 87 in the seal 53. The needle 201 works to restrict further deformation of the outer cover 23 by abutting on the edge 47a of the vent 47. Meanwhile, the tip 201a of the needle 201 does not completely pass through the vent 47 but remains inside the vent 47. In this manner, the HDD 10 of the present embodiment enables the work of forming the hole 87 with the needle 92 to be ensured and can avoid damaging a component or components such as the desiccant filter 52 in the space S1, which may otherwise occur due to the needle 92 entering the space S1.

In the above description, suppression is defined as, for example, preventing an event, action, or influence, or reducing the degree of the event, action, or influence. Furthermore, in the above description, limitation is defined as, for example, preventing movement or rotation, or permitting the movement or rotation within a predetermined range and preventing the movement or rotation beyond the predetermined range.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A disk drive comprising:
   a magnetic disk;
   a housing including
      a base having a first space in which the magnetic disk is accommodated, a first cover with a first hole, attached to the base, and
      a second cover joined to the base so as to cover the first cover, wherein
      the first cover is located between the second cover and the first space to close the first space,
      the first cover and the second cover are placed with a second space in-between, and
      the first hole allows communication between the first space and the second space;
   a seal with a second hole, attached to the first cover, the second hole allowing communication between the second space and the first hole; and
   a piercing member including
      an attachment part attached to the second cover in the second space, and
      a needle protruding from the attachment part toward the second hole.

2. The disk drive according to claim 1, wherein the needle is made of metal.

3. The disk drive according to claim 2, wherein
   the seal includes a metal layer and an adhesive layer, the adhesive layer located between the metal layer and the first cover and attached to the first cover.

4. The disk drive according to claim 3, wherein
   the metal layer has a Vickers hardness equal to or less than the needle.

5. The disk drive according to claim 3, wherein
   the metal layer includes
      a first part with the second hole, and
      a second part thicker in thickness than the first part, and surrounding the first part.

6. The disk drive according to claim 3, wherein
   the adhesive layer is provided with a third hole that communicates with the first hole, and
   the second hole communicates with the first hole through the third hole.

7. The disk drive according to claim 1, further comprising:
   a filter attached to the first cover in the first space so as to cover the first hole, wherein
   the seal is located in the second space.

8. The disk drive according to claim 1, wherein
the piercing member includes an abutment surface facing the first cover, and
when the abutment surface abuts on the first cover or the seal located in the second space, a tip of the needle is located inside the first hole.

9. The disk drive according to claim 8, wherein
when projected in a direction in which the first hole extends through the first cover, the needle has a smaller projection plane than the first hole.

10. The disk drive according to claim 1, wherein
when the needle abuts on an edge of the first hole, a tip of the needle is located inside the first hole.

11. The disk drive according to claim 1, wherein
the second cover includes
   a stationary part fixed to the first cover, and
   a movable part spaced apart from the first cover and to which the piercing member is attached, and
the movable part is deformable to approach the first hole.

12. The disk drive according to claim 1, wherein
the first space is filled with a gas different from air.

13. The disk drive according to claim 12, wherein
the gas contains helium.

14. A disk drive manufacturing method comprising:
housing a magnetic disk in a first space in a base;
closing the first space with a first cover by attaching the first cover to the base;
filling the first space with a gas different from air through a first hole in the first cover;
sealing the first hole with a seal by attaching the seal to the first cover;
covering the first cover with a second cover by joining the second cover to the base; and
forming, in the seal, a second hole to allow communication between the first space and a second space, by deforming the second cover having a piercing member attached such that the piercing member pierces the seal in the second space between the first cover and the second cover.

* * * * *